United States Patent
Singh et al.

(10) Patent No.: US 9,349,437 B2
(45) Date of Patent: May 24, 2016

(54) MEMORY CELL HAVING BUILT-IN READ AND WRITE ASSIST

(71) Applicant: LSI Corporation, San Jose, CA (US)

(72) Inventors: Sahilpreet Singh, Bangalore (IN); Anjana Das, Bangalore (IN)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 28 days.

(21) Appl. No.: 14/280,052

(22) Filed: May 16, 2014

(65) Prior Publication Data
US 2015/0332755 A1 Nov. 19, 2015

(51) Int. Cl.
G11C 11/419 (2006.01)
G11C 5/06 (2006.01)

(52) U.S. Cl.
CPC ............... *G11C 11/419* (2013.01); *G11C 5/06* (2013.01)

(58) Field of Classification Search
CPC .............................. G11C 11/419; G11C 5/06
USPC ........................ 365/72, 154, 185.07
See application file for complete search history.

(56) References Cited

U.S. PATENT DOCUMENTS

| | | | |
|---|---|---|---|
| 2007/0139996 A1* | 6/2007 | Ozawa | ...................... 365/154 |
| 2012/0140552 A1 | 6/2012 | Seikh et al. | |
| 2012/0155151 A1 | 6/2012 | Rachamadugu et al. | |
| 2012/0212996 A1 | 8/2012 | Rao et al. | |

OTHER PUBLICATIONS

Debasis Mukherjee et al., "Static Noise Margin Analysis of SRAM Cell for High Speed Application," International Journal of Computer Science Issues, Sep. 2010, pp. 175-180, vol. 7, Issue 5.

G. Razavipour et al., "Design and Analysis of Two Low Power SRAM Cell Structures," IEEE Transactions on VLSI Systems, Oct. 2009, pp. 1551-1555, vol. 17, Issue 10.

* cited by examiner

*Primary Examiner* — Pho M Luu
*Assistant Examiner* — Mohammed A Bashar

(57) ABSTRACT

A memory cell having integrated read and write assist functionality includes a storage element and first and second switching circuits. The first switching circuit is configured to selectively couple a first internal storage node of the storage element with a first bit line. The second switching circuit is configured to selectively couple a second internal storage node of the storage element with a second bit line. During a read operation, at least one of the first and second switching circuits is configured to increase a switching threshold of at least one inverter in the storage element. During a write operation, at least one of the first and second switching circuits is configured such that ground bounce associated with at least one of the first and second switching circuits assists in writing a logical state of the memory cell.

21 Claims, 9 Drawing Sheets

MEMORY CELL HAVING BUILT-IN READ AND WRITE ASSIST

FIELD OF THE INVENTION

The present invention relates generally to electrical and electronic circuitry, and more particularly relates to memory devices.

BACKGROUND

A memory device is typically comprised of memory cells arranged in an array of rows and columns, with each memory cell storing one or more bits of data. Memory cells within a given row of the array are connected to a common word line, while memory cells within a given column of the array are connected to a common bit line. Each of the memory cells in the array is coupled to a unique pair of a corresponding bit line and word line for selectively accessing the memory cell.

Traditionally, in the context of static random access memory (SRAM), six-transistor (6T) SRAM cells have been employed. Unlike dynamic random access memory (DRAM) cells, SRAM cells have the ability to hold data without requiring refreshing, and are therefore advantageous. However, as transistor geometries continue to shrink, it becomes increasingly more difficult to prevent local mismatch between the transistors forming the memory cells. This mismatch can adversely affect memory device performance, including, for example, the ability to consistently write data to the memory cells at low voltages (e.g., about one volt or less). To further exacerbate this problem, there has been a trend to reduce operating voltages of memory circuits, thereby reducing read and write margins of the SRAM cells which measure how reliably data can be read from and written to the SRAM cells, respectively. Due to the existence of static noise, among other factors, the reduced read and write margins may introduce errors in the respective read and write operations.

SUMMARY

In accordance with an embodiment of the invention, a memory cell having integrated read and write assist functionality includes a storage element for storing a logical state of the memory cell, and first and second switching circuits. The first switching circuit is configured to selectively couple a first internal storage node of the storage element with a first bit line as a function of a first plurality of control signals. The second switching circuit is configured to selectively couple a second internal storage node of the storage element with a second bit line as a function of a second plurality of control signals. During a read operation of the memory cell, at least one of the first and second switching circuits is configured to increase a switching threshold of at least one inverter in the storage element. During a write operation of the memory cell, at least one of the first and second switching circuits is configured such that ground bounce associated with at least one of the first and second switching circuits assists in writing a logical state of the memory cell. Other embodiments of the invention include, but are not limited to, being manifest as a memory cell fabricated as at least part of an integrated circuit, a memory device, and an electronic system. Additional and/or other embodiments of the invention are described in the following written description, including the claims, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
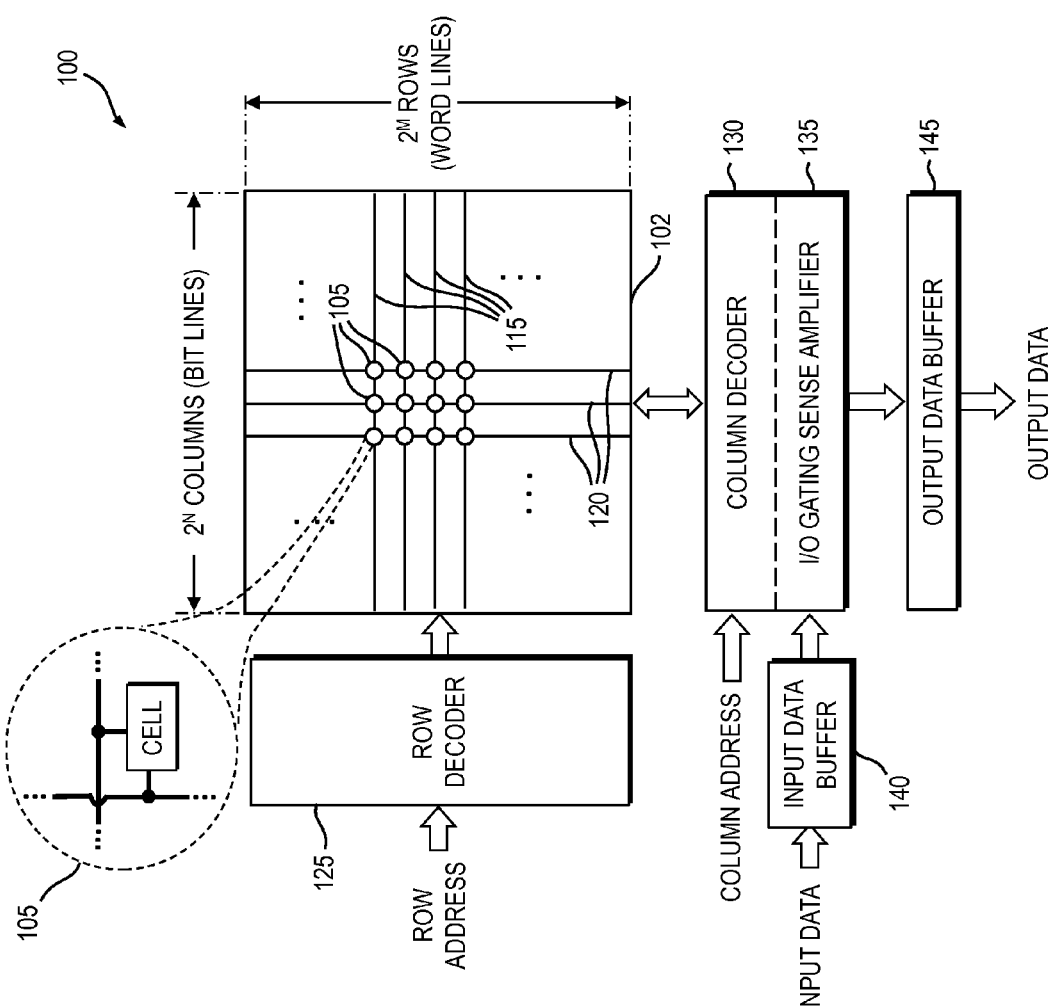
FIG. 1 schematically depicts an illustrative memory device in which one or more aspects of the invention can be employed, in the context of the present disclosure.

It is to be appreciated that the drawings described herein are presented for illustrative purposes only. Moreover, common but well-understood elements and/or features that may be useful or necessary in a commercially feasible embodiment may not be shown in order to facilitate a less hindered view of the illustrated embodiments.

Written Description

Embodiments of the invention will be described herein in the context of illustrative SRAM circuits and associated SRAM cells with read and write assist. It should be understood, however, that embodiments of the invention are not limited to these or any other particular circuit arrangements. Rather, embodiments of the invention are more broadly applicable to any memory system, single-port or multi-port, in which enhanced low-voltage read and write performance is desired, without concern for whether the memory is embedded or standalone. In this regard, embodiments of the invention provide read assist and write assist schemes that beneficially reduce memory cycle time in a variety of memory arrangements and types, such as, for example, random access memory (RAM), SRAM, content addressable memory (CAM), flash memory, memory caches, register files, port buffer memories, and the like, without significantly increasing semiconductor area of the memory. Moreover, it will become apparent to those skilled in the art given the teachings herein that numerous modifications can be made to the illustrative embodiments shown that are within the scope of the claimed invention. That is, no limitations with respect to the embodiments shown and described herein are intended or should be inferred.

As a preliminary matter, for purposes of clarifying and describing embodiments of the invention, the following table provides a summary of certain acronyms and their corresponding definitions, as the terms are used herein:

Table of Acronym Definitions

| Acronym | Definition |
| --- | --- |
| SRAM | Static random access memory |
| 6T | Six-transistor |
| RAM | Random access memory |
| CAM | Content addressable memory |
| MISFET | Metal-insulator-semiconductor field-effect transistor |
| MOSFET | Metal-oxide-semiconductor field-effect transistor |
| FET | Field-effect transistor |
| NFET | N-channel field-effect transistor |
| NMOS | N-channel metal-oxide-semiconductor |
| PFET | P-channel field-effect transistor |
| PMOS | P-channel metal-oxide-semiconductor |
| CMOS | Complementary metal-oxide-semiconductor |
| MOS | Metal-oxide-semiconductor |
| BJT | Bipolar junction transistor |
| SNM | Static noise margin |
| RNM | Retention noise margin |
| WM | Write margin |
| RM | Read margin |
| RT | Read time |
| WT | Write time |

Throughout the description herein, the term MISFET is intended to be construed broadly and to encompass any type of metal-insulator-semiconductor field-effect transistor. The term MISFET is, for example, intended to encompass semiconductor field-effect transistors (FETs) that utilize an oxide material as their gate dielectric, as in the case of metal-oxide-semiconductor field-effect transistors (MOSFETs), as well as those that do not. In addition, despite a reference to the term "metal" in the acronym MISFET, the term MISFET is intended to encompass semiconductor field-effect transistors wherein the gate is formed from a non-metal, such as, for instance, polysilicon.

Although embodiments of the invention described herein may be implemented using p-channel MISFETs (hereinafter called "PFETs" or "PMOS" devices) and/or n-channel MISFETs (hereinafter called "NFETs" or "NMOS" devices), as may be formed using a complementary metal-oxide-semiconductor (CMOS) fabrication process, it is to be appreciated that embodiments of the invention are not limited to such transistor devices and/or such a fabrication process, and that other suitable devices, such as, for example, bipolar junction transistors (BJTs), FinFETs, etc., and/or fabrication processes (e.g., bipolar, BiCMOS, etc.), may be similarly employed, as will be understood by those skilled in the art. Moreover, although embodiments of the invention are typically fabricated in a silicon wafer, embodiments of the invention can alternatively be fabricated in wafers comprising other materials, including but not limited to gallium arsenide (GaAs), indium phosphide (InP), etc.

Many modern high-speed memories, including, but not limited to, caches, register files, port buffer memories, CAMs, etc., demand single-port and multi-port SRAMs having fast read and write times. There are several known circuits and architectural techniques for speeding up read and write times in the memory/register file with a capability to speed up data flow through logic circuitry in the memory/register file. Read time is often determined as a sum of the time to assert an enable signal on a selected word line and the time to transfer data from a selected memory cell being read to a corresponding bit line. Likewise, write time is often determined as a sum of the time to assert an enable signal on a selected word line and the time to transfer data to be written to a selected memory cell from a corresponding bit line. Read and write times are critical timing parameters that limit the cycle time of memory devices.

FIG. 1 is a schematic diagram depicting at least a portion of an illustrative memory device 100 in which one or more aspects of the invention can be employed, in the context of the present disclosure. The memory device 100 includes a memory array 102 comprising a plurality of memory cells 105, each of the memory cells being configured to store one or more bits of data. Each memory cell 105 in a given row is coupled with a corresponding common word line 115, and each cell in a given column is coupled with a corresponding common bit line 120, such that the memory array 102 includes a memory cell 105 at each intersection of a word line 115 and a bit line 120. In this illustrative embodiment, the memory array 102 is organized having $2^M$ rows and $2^N$ columns, where M and N are integers. The values of M and N will depend upon the particular data storage requirements of the application in which the memory device 100 is used. Embodiments of the invention are not limited to any specific values for M and N; moreover, M and N may be the same.

The memory cells 105 in memory device 100 can be individually accessed for writing data thereto (e.g., during a write operation) or reading data therefrom (e.g., during a read operation) by activation of appropriate row and column addresses to row decoder 125 and column decoder 130, respectively. The memory device 100 includes additional circuitry for facilitating the read and write operations, including, for example, an input/output (I/O) gating sense amplifier 135, input data buffers 140, and output data buffers 145.

Figure 2:
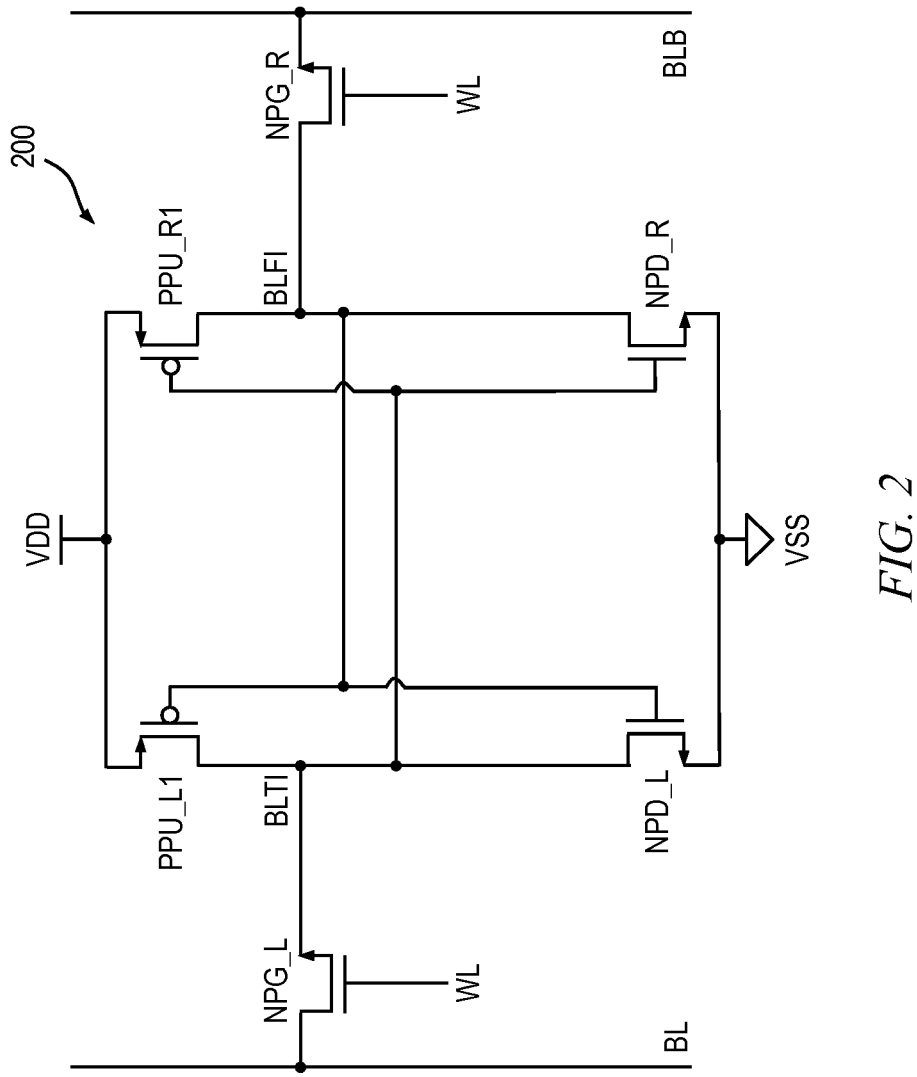
FIG. 2 schematically depicts an illustrative single-port SRAM cell suitable for use in the exemplary memory device shown in FIG. 1.

FIG. 2 schematically depicts an illustrative single-port SRAM cell 200 suitable for use in the exemplary memory device 100 shown in FIG. 1, in the context of the present disclosure. The SRAM cell 200 includes one word line (WL) and a pair of complementary bit lines (BL/BLB) coupled to the cell for accessing the cell (e.g., reading and writing). In SRAM cell 200, there is no read assist or write assist employed. The SRAM cell 200 is implemented, in this example, as a 6T SRAM cell, although it is to be appreciated that embodiments of the invention are not limited to 6T SRAM cells.

The illustrative SRAM cell 200 includes first and second NFETs, NPG_L and NPG_R, operative as switching devices (e.g., pass gates), and a pair of cross-coupled inverters operative as a storage element (e.g., latch) for the SRAM cell. Specifically, a first inverter includes a PFET, PPU_L1, and an NFET, NPD_L, and a second inverter includes a PFET, PPU_R1, and an NFET, NPD_R. A drain of NPG_L is coupled with bit line BL, which may be a true bit line, a gate of NPG_L is coupled with the word line WL, and a source of NPG_L is connected with drains of PPU_L1 and NPD_L at node BLTI. Sources of PPU_L1 and PPU_R1 are connected with a voltage supply, which is VDD in this embodiment, sources of NPD_L and NPD_R are connected with a voltage return, which is VSS in this embodiment, gates of PPU_L1 and NPD_L are connected with drains of PPU_R1 and NPD_R at node BLFI, and gates of PPU_R1 and NPD_R are connected to node BLTI. A gate of NPG_R is coupled with the word line WL, a drain of NPG_R is connected with node BLFI, and a source of NPG_R is coupled with bit line BLB, which may be a complement bit line.

It is to be appreciated that because a MISFET device is symmetrical in nature, and thus bi-directional, the assignment of source and drain designations in the MISFET device is essentially arbitrary. Therefore, the source and drain of a given MISFET device may be referred to herein generally as first and second source/drain, respectively, where "source/drain" in this context denotes a source or a drain.

Several parameters can be used to evaluate the performance of a memory cell, including, but not limited to, static noise margin (SNM), retention noise margin (RNM), write margin (WM), read margin (RM), read time (RT) and write time (WT). Static noise margin, which affects both read margin and write margin, is related to threshold voltages of the NFET and PFET devices in the SRAM cell. (See, e.g., Debasis Mukherjee et al., "Static Noise Margin Analysis of SRAM Cell for High Speed Application," *International Journal of Computer Science Issues*, vol. 7, issue 5, pp. 175-180, September 2001, the disclosure of which is incorporated herein by reference in its entirety.) Write margin corresponds to a minimum voltage difference between the bit lines which still enables writing to be performed in the SRAM cell. Retention noise margin is indicative of the static noise margin of the SRAM cell with the word line not selected (i.e., inactive or deasserted); for example, when WL is a logic low level in this embodiment. In other words, the RNM of the SRAM cell 200 corresponds to a difference between voltages on the internal nodes, BLTI and BLFI, and a failure threshold for those voltages when the memory cell is retaining data. Write time is indicative of a time delay between the availability of data on the bit lines BL/BLB to be written into the SRAM cell 200 and activation of the corresponding word line WL coupled with the SRAM cell. As previously stated, read time is generally determined as a sum of the time to assert an enable signal on a selected word line and the time to transfer data from a selected memory cell being read to a corresponding bit line, where it is then sensed (e.g., by a sense amplifier coupled with the bit line).

Often, by improving one SRAM cell parameter, another cell parameter is degraded. For example, SNM and WM are complementary to one another, and thus if SNM is improved, WM worsens, and vice versa. To increase SNM, the threshold voltages of the NFET and PFET devices in the SRAM cell can be altered. However, for applications in which reduced operating voltages are desired, altering the threshold voltages of the NFET and PFET devices would have a detrimental impact on SRAM cell performance. More particularly, when the respective threshold voltages of the NFET and PFET devices are altered to improve the SNM, it will degrade the WM, and vice versa, as these are complementary characteristics of the memory cell. Consequently, in accordance with one or more embodiments of the invention, the threshold voltages of NFET and/or PFET devices in the SRAM memory cell are configured so as to achieve a prescribed balance between WM and SNM, which ultimately will determine an overall performance of the SRAM cell.

As integrated circuit technology continues to scale downward, operating voltages are being reduced accordingly. As a result of this scaling of operating voltages, memory cells have become more prone to SNM and WM failures. Moreover, attempts at improving these characteristics by merely maintaining device sizing ratios generally yield a memory cell having degraded stability, which is undesirable. Thus, with increasing pressure to reduce operating voltages in memory systems, SNM and WM have become parameters of keen interest in SRAM cell designs, as these parameters tend to degrade considerably with decreasing supply voltage.

It is known to employ external read assist and write assist techniques for use in conjunction with SRAM cells. However, for certain applications, such as, for example, high-speed register files, conventional write assist techniques, which generally utilize capacitive charge pump based circuitry, significantly increase area, power consumption and complexity of the memory device, and impact memory speed. Consequently, standard read assist and write assist approaches are not preferred.

In order to achieve enhanced read and write performance in a memory cell, one or more embodiments of the present invention provides a novel memory cell having built-in read and write assist circuitry for a common bit line pair, and thus does not require any external circuitry for performing read and write assist functionality. The memory cell according to embodiments of the invention is stable in terms of both SNM and WM parameters. This stability is achieved by design of the memory cell, and does not rely on particular transistor sizes or sizing ratios between pull-up transistors, pull-down transistors and pass gates of the memory cell. In fact, all of the transistors can be equally sized for facilitating layout and area optimization, in accordance with one or more embodiments, without comprising speed and/or reliability of the memory cell. Moreover, the memory cell according to one or more embodiments of the invention does not require isolation between read and write circuitry of the memory cell which would otherwise increase area and power consumption of the cell and limit memory architectures which can be supported. As a result, embodiments of the invention beneficially provide a memory cell which can be broadly integrated with essentially any memory architecture (e.g., inverter sensing, sense amplifier (balanced and unbalanced), multiplexer support, bit-write support, etc.) in essentially any technology.

Figure 3A:
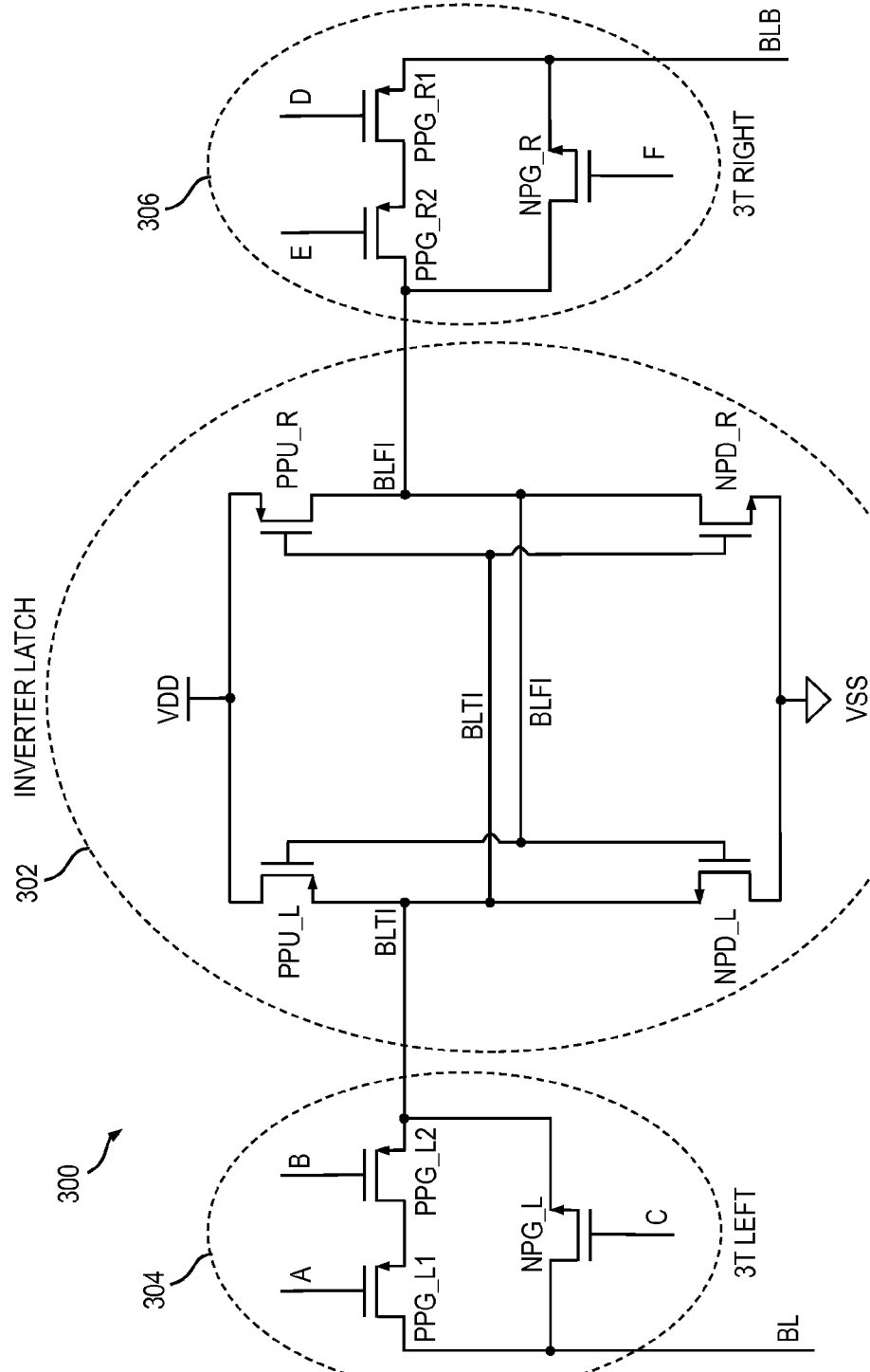
FIG. 3A is a schematic diagram depicting at least a portion of an exemplary SRAM cell with built-in read and write assist functionality, according to an embodiment of the invention.

FIG. 3A is a schematic diagram depicting at least a portion of an exemplary SRAM cell 300 with built-in read and write assist functionality, according to an embodiment of the invention. Like the SRAM cell 200 shown in FIG. 2, SRAM cell 300 includes a storage element 302 comprised of a pair of cross-coupled inverters forming a latch operative to store a data bit. More particularly, a first inverter includes PFET PPU_L and NFET NPD_L, and a second inverter includes PFET PPU_R and NFET NPD_R. Sources of PPU_L AND PPU_R are adapted for connection with a voltage supply, which in this embodiment is VDD, sources of NPD_L and NPD_R are adapted for connection with a voltage return, which in this embodiment is VSS, gates of PPU_L and NPD_L are connected with drains of PPU_R and NPD_R at node BLFI, and gates of PPU_R and NPD_R are connected with drains of PPU_L and NPD_L at node BLTI. Nodes BLTI and BLFI represent complementary internal storage nodes of the storage element 302.

The SRAM cell 300 further includes a first switching circuit 304 and a second switching circuit 306 for selectively connecting the storage element 302 with complementary bit lines BL and BLB, respectively. Each of the first and second switching circuits 304 and 306, respectively, comprises integrated read and write assist circuitry and is implemented, in this embodiment, using a three-transistor (3T) transmission gate configuration. Specifically, the first switching circuit 304 includes two series-connected PFET devices, PPG_L1 and PPG_L2, coupled in parallel with an NFET NPG_L. Likewise, the second switching circuit 306 includes two series-connected PFET devices, PPG_R1 and PPG_R2, coupled in parallel with an NFET NPG_R.

More particularly, the first switching circuit 304 is configured such that drains of PPG_L1 and NPG_L are coupled with bit line BL, a source of PPG_L1 is connected with a drain of PPG_L2, and sources of PPG_L2 and NPG_L are connected with drains of PPU_L and NPD_L at node BLTI. A gate of PPG_L1 is adapted to receive a first control signal at node A, a gate of PPG_L2 is adapted to receive a second control signal at node B, and a gate of NPG_L is adapted to receive a third control signal at node C. Thus, the first switching circuit 304 provides two signal paths through which the storage element 302 can be connected with bit line BL; namely, a first signal path through PFET devices PPG_L1 and PPG_L2, and a second signal path through NFET NPG_L. When either of the first or second control signals is at a logic high level (e.g., VDD), a corresponding one of the PFET devices is turned off, thereby disabling the first signal path; the first signal path is enabled when both the first and second control signals are at a logic low level. When the third control signal is at a logic high level, NPG_L is turned on, thereby enabling the second signal path; the second signal path is disabled when the third control signal is at a logic low level, which turns off NPG_L. When the first and second control signals are at a logic low level and the third control signal is at a logic high level, the internal storage node BLTI is connected to bit line BL through both the first and second signal paths in the first switching circuit 304. When at least one of the first and second control signals is at a logic high level and the third control signal is at a logic low level, the internal storage node BLTI is electrically disconnected from bit line BL.

Similarly, the second switching circuit 306 is configured such that sources of PPG_R1 and NPG_R are coupled with complementary bit line BLB, a drain of PPG_R1 is connected with a source of PPG_R2, and drains of PPG_R2 and NPG_R are connected with drains of PPU_R and NPD_R at node BLFI. A gate of PPG_R1 is adapted to receive a fourth control signal at node D, a gate of PPG_R2 is adapted to receive a fifth control signal at node E, and a gate of NPG_R is adapted to receive a sixth control signal at node F. Thus, like the first switching circuit 304, the second switching circuit 306 provides two signal paths through which the storage element 302 can be connected with bit line BLB; namely, a first signal path through PFET devices PPG_R1 and PPG_R2, and a second signal path through NFET NPG_R. When either of the fourth or fifth control signals is at a logic high level (e.g., VDD), a corresponding one of the PFET devices is turned off, thereby disabling the first signal path; the first signal path is enabled when both the fourth or fifth control signals are at a logic low level. When the sixth control signal is at a logic high level, NPG_R is turned on, thereby enabling the second signal path; the second signal path is disabled when the sixth control signal is at a logic low level, which turns off NPG_R. When the fourth and fifth control signals are at a logic low level and the sixth control signal is at a logic high level, the internal storage node BLFI is connected to bit line BLB through both the first and second signal paths in the second switching circuit 306. When at least one of the fourth and fifth control signals is at a logic high level and the sixth control signal is at a logic low level, the internal storage node BLFI is electrically disconnected from bit line BLB.

Figure 3B:
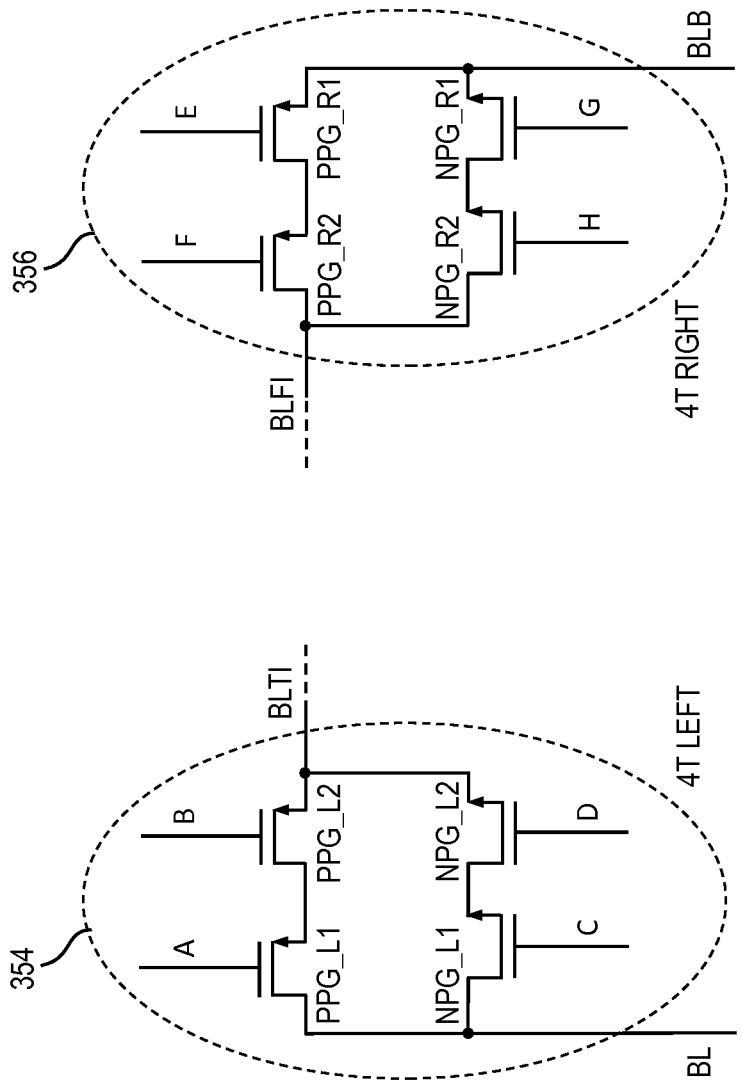
FIG. 3B is a schematic diagram depicting exemplary switching circuits suitable for use in the illustrative SRAM cell shown in FIG. 3A, according to an embodiment of the invention.

The 3T transmission gate structure forming the first and second switching circuits 304, 306 beneficially provides two independently controlled signal paths for connecting the storage element 302 with a corresponding bit line BL, BLB. It is to be appreciated that embodiments of the invention are not limited to the 3T structure shown. For example, at least one of the first and second switching circuits 304 and 306, respectively, shown in FIG. 3A can be implemented using a four-transistor (4T) switch structure, as shown in FIG. 3B. As apparent from FIG. 3B, a first switching circuit 354 includes two series-connected PFET devices, PPG_L1 and PPG_L2, coupled in parallel with two series-connected NFET devices, NPG_L1 and NPG_L2. Likewise, the second switching circuit 356 includes two series-connected PFET devices, PPG_R1 and PPG_R2, coupled in parallel with two series-connected NFET devices NPG_R1 and NPG_R2.

More particularly, with reference to FIG. 3B, the first switching circuit 354 is configured such that drains of PPG_L1 and NPG_L1 are coupled with bit line BL, a source of PPG_L1 is connected with a drain of PPG_L2, a source of NPG_L1 is connected with a drain of NPG_L2, and sources of PPG_L2 and NPG_L2 are connected together at node BLTI. A gate of PPG_L1 is adapted to receive a first control signal at node A, a gate of PPG_L2 is adapted to receive a second control signal at node B, a gate of NPG_L1 is adapted to receive a third control signal at node C, and a gate of NPG_L2 is adapted to receive a fourth control signal at node D. Thus, the first switching circuit 354, like switching circuit 304 shown in FIG. 3A, provides two independently-controlled signal paths through which the storage element 302 can be connected with bit line BL; namely, a first signal path through PFET devices PPG_L1 and PPG_L2, and a second signal path through NFET devices NPG_L1 and NPG_L2. When either of the first or second control signals is at a logic high level (e.g., VDD), a corresponding one of the PFET devices is turned off, thereby disabling the first signal path; the first signal path is enabled when both the first and second control signals are at a logic low level. Similarly, when either of the third or fourth control signals is at a logic low level (e.g., VSS or zero volt), a corresponding one of the NFET devices is turned off, thereby disabling the second signal path; the second signal path is enabled when both the third and fourth control signals are at a logic high level. When the first and second control signals are at a logic low level and the third and fourth control signals are at a logic high level, the internal storage node BLTI is connected to bit line BL through both the first and second signal paths in the first switching circuit 354. When at least one of the first and second control signals is at a logic high level and at least one of the third and fourth control signals is at a logic low level, the internal storage node BLTI is electrically disconnected from bit line BL.

Similarly, the second switching circuit 356 is configured such that sources of PPG_R1 and NPG_R1 are coupled with complementary bit line BLB, a drain of PPG_R1 is connected with a source of PPG_R2, a drain of NPG_R1 is connected with a source of NPG_R2, and drains of PPG_R2 and NPG_R2 are connected together at node BLFI. A gate of PPG_R1 is adapted to receive a fifth control signal at node E, a gate of PPG_R2 is adapted to receive a sixth control signal at node F, a gate of NPG_R1 is adapted to receive a seventh control signal at node G, and a gate of NPG_R2 is adapted to receive an eighth control signal at node H. Thus, like the first switching circuit 354, the second switching circuit 356 provides two signal paths through which the storage element (302 in FIG. 3A) can be connected with bit line BLB; namely, a first signal path through PFET devices PPG_R1 and PPG_R2, and a second signal path through NFET devices NPG_R1 and NPG_R2. When either of the fifth or sixth control signals is at a logic high level (e.g., VDD), a corresponding one of the PFET devices is turned off, thereby disabling the first signal path; the first signal path is enabled when both the fifth and sixth control signals are at a logic low level. When either of the seventh or eighth control signals is at a logic low level (e.g., VSS), a corresponding one of the NFET devices is turned off, thereby disabling the second signal path; the second signal path is enabled when both the seventh and eighth control signals are at a logic high level. When the fifth and sixth control signals are at a logic low level and the seventh and eighth control signals are at a logic high level, the internal storage node BLFI is connected to bit line BLB through both the first and second signal paths in the second switching circuit 356. When at least one of the fifth and sixth control signals is at a logic high level and at least one of the seventh and eighth control signals is at a logic low level, the internal storage node BLFI is electrically disconnected from bit line BLB.

Figure 4:
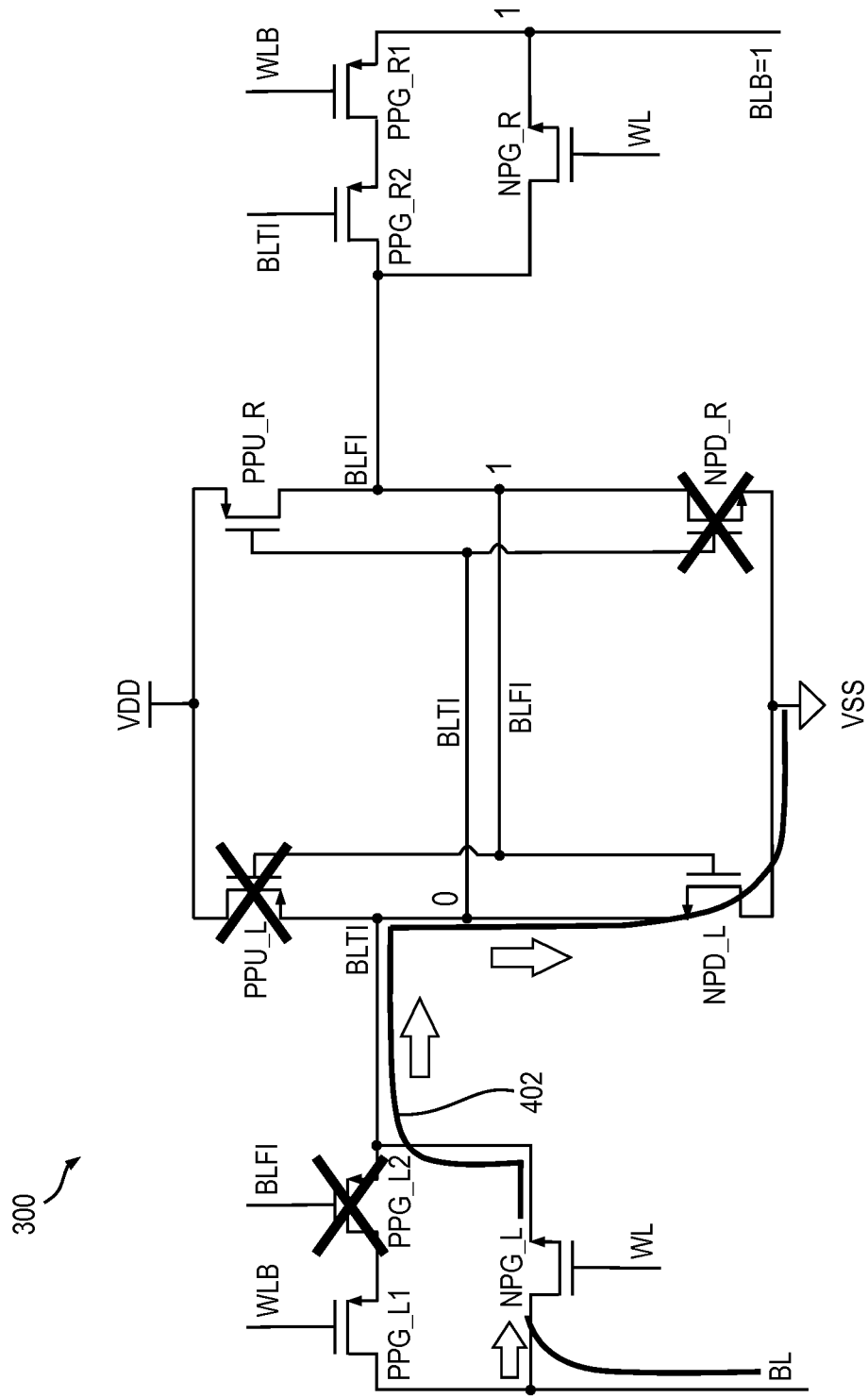
FIG. 4 is a schematic diagram depicting at least a portion of the exemplary SRAM cell with built-in read and write assist functionality shown in FIG. 3A during a read operation, according to an embodiment of the invention.

By way of example only and without limitation, FIG. 4 is a schematic diagram depicting at least a portion of the exemplary SRAM cell 300 with built-in read and write assist functionality shown in FIG. 3A during a read operation, according to an embodiment of the invention. As apparent from FIG. 4, SRAM cell 300 is shown with connections to nodes A, B, C, D, E and F, in accordance with an illustrative embodiment of the invention. Specifically, FIG. 4 shows an embodiment of the SRAM cell 300 in which nodes A and D connected with the gates of PPG_L1 and PPG_R1, respectively, are driven by an inverted (i.e., complementary) word line signal WLB, node B connected with the gate of PPG_L2 is driven by internal storage node BLFI, nodes C and F connected with the gates of NPG_L and NPG_R, respectively, are driven by word line signal WL, and node E connected with the gate of PPG_R2 is driven by internal storage node BLTI.

In an embodiment where the switching circuits are implemented using the illustrative 4T switching circuits 354 and 356 shown in FIG. 3B, nodes A and E connected with the gates of PPG_L1 and PPG_R1, respectively, are preferably driven by an inverted (i.e., complementary) word line signal WLB, nodes B and H connected with the gates of PPG_L2 and NPG_R2, respectively, are driven by internal storage node BLFI, nodes C and G connected with the gates of NPG_L1 and NPG_R1, respectively, are driven by word line signal WL, and nodes D and F connected with the gates of NPG_L2 and PPG_R2, respectively, are driven by internal storage node BLTI.

With reference to FIG. 4, consider a default state of SRAM cell 300. During a default (i.e., initial) state of the SRAM cell 300, such as when the cell is not being accessed in conjunction with a read or write operation, the word line WL will be at logic low level (i.e., de-asserted or disabled) and the complementary bit lines BL and BLB will be pre-charged to a logic high level (e.g., "1" or VDD), in this example. With the word line WL at a logic low level (e.g., "0" or VSS), the complementary word line WLB will be at a logic high level. Accordingly, NFET devices NPG_L and NPG_R, and PFET devices PPG_L1 and PPG_R1 will be turned off, thereby electrically disconnecting the internal storage nodes BLTI and BLFI from the bit lines BL and BLB, respectively. Moreover, assume that the data stored in the storage element (302 in FIG. 3A) is a logic "0," such that internal storage node BLTI is at a logic low level and complementary internal storage node BLFI is at a logic high level. In this scenario, PFET device PPU_R and NFET device NPD_L will be turned on, and PFET device PPU_L and NFET device NPD_R will be turned off, thereby allowing node BLTI to be pulled low through NPD_L and node BLFI to be pulled high through PPU_R.

During a read operation, the bit lines BL and BLB are released from their pre-charged state (e.g., by disconnecting the bit lines from pre-charge circuitry, not explicitly shown but implied) and the word line WL connected with a selected memory cell is asserted; in this example, WL is driven to a logic high level (e.g., VDD). With the word line WL at a logic high level, the inverted word line WLB will be at a logic low level. From the perspective of a left side of the SRAM cell 300, NFET NPG_L and PFET PPG_L1 will turn on when the word line WL goes high and word line WLB goes low, respectively (e.g., when WL rises above an NFET threshold voltage and WLB falls below a PFET threshold voltage). With the internal storage node BLFI being at a logic high level, PFET PPG_L2 will be turned off, thereby disabling the first signal path through PPG_L1 and PPG_L2 in the first switching circuit (304 in FIG. 3A). Thus, the internal storage node BLTI will be connected with bit line BL through NPG_L (i.e., through the second signal path in the first switching circuit 304) and the voltage stored in the storage element (302 in FIG. 3A) at node BLTI will be allowed to develop on bit line BL.

During the read "0" operation, bit line BL, which was initially pre-charged to a high voltage level (e.g., VDD), will begin to discharge to VSS through a signal path 402 comprising NFETs NPG_L and NPD_L, until the voltage on bit line BL is substantially equal to the voltage on node BLTI. The discharging of bit line BL is detected by a corresponding sense amplifier (not explicitly shown, but implied) coupled to the bit line BL for generating an output signal that is indicative of a sensed logic state of the SRAM cell 300. The time required for the voltage to develop on the bit line BL will be a function of a time constant of the signal path 402, which is influenced by a capacitance of the bit line BL, source-to-drain on-resistance of the NFETs NPG_L and NPD_L, and a sum of the resistances associated with interconnect routing of the signal path 402, among other factors.

The discharging of bit line BL will result in ground bounce on internal storage node BLTI. This ground bounce may, in some instances, lead to a flipping (i.e., reversal) of the logic state of the latch, thus resulting in a read error, if a voltage level of the ground bounce increases beyond a switching threshold of the inverter comprising devices PPU_R and NPD_R. The tendency of a memory cell to erroneously change state during the read operation is often characterized by the SNM parameter of the cell, which can be defined as a difference between an inverter switching threshold and the amount of ground bounce (i.e., SNM=inverter threshold–ground bounce). In the example shown in FIG. 4, SNM=inverter threshold of PPU_R and NPD_R–ground bounce on node BLTI. SNM can be improved by either increasing the threshold of the inverter or by reducing the amount of ground bounce. The illustrative SRAM cell 300 improves SNM, in one or more embodiments, by increasing the threshold of the inverter. This is achieved through the use of the 3T switching circuits operative to selectively connect the storage element with the bit lines, in accordance with embodiments of the invention, as will be described in further detail below.

From the perspective of a right side of the SRAM cell 300, during the read "0" operation, NFET NPG_R and PFET PPG_R1 will turn on when the word line WL goes high and word line WLB goes low, respectively. With NPG_R turned on, the second signal path in the second switching circuit (306 in FIG. 3A) will be enabled. With the internal storage node BLTI being at a logic low level, PFET PPG_R2 will turn on, thereby enabling the first signal path through PPG_R1 and PPG_R2 in the second switching circuit. Thus, the internal storage node BLFI will be connected with bit line BLB through two parallel signal paths; namely, through PPG_R1 and PPG_R2, and through NPG_R (i.e., through the first and second signal paths in the second switching circuit 306). In this example, with the bit line BLB pre-charged high (e.g., VDD), the voltage stored in the storage element (302 in FIG. 3A) at node BLFI will be substantially equal to the voltage on bit line BLB, and thus no charging or discharging of the complementary bit line BLB through the storage element will occur.

By way of comparison, in the illustrative 6T SRAM cell 200 without read or write assist circuitry shown in FIG. 2, the internal storage node BLFI will be held high through the single PFET PPU_R1 in the second inverter (i.e., the inverter including PFET PPU_R1 and NFET NPD_R). In the exemplary SRAM cell 300 shown in FIG. 4, however, node BLFI is held high not only through the pull-up PFET PPU_R in the second inverter, but also by the 3T transmission gate structure comprising transistors PPG_R1, PPG_R2 and NPG_R which form the second switching circuit (306 in FIG. 3A). This results in an increased threshold of the inverter, and hence improved SNM.

In the case of a read "1" operation, the SRAM cell 300 functions in essentially the same manner as for the read "0" operation previously described, only with the operation of the left and right sides of the cell reversed. More particularly, during a read "1" operation of SRAM cell 300, the bit lines BL and BLB are released from their initially pre-charged (high) state and the word line WL connected with the cell is asserted; in this example, WL is driven to a logic high level (e.g., VDD). With the word line WL at a high level, the inverted word line WLB will be at a logic low level (e.g., VSS). From the perspective of the right side of the SRAM cell 300, NFET NPG_R and PFET PPG_R1 will turn on when the word line WL goes high and word line WLB goes low, respectively (e.g., when WL rises above an NFET threshold voltage and WLB falls below a PFET threshold voltage). With the internal storage node BLTI being at a logic high level, PFET PPG_R2 will be turned off, thereby disabling the second signal path through PPG_R1 and PPG_R2 in the second switching circuit (306 in FIG. 3A). Thus, the internal storage node BLFI will be connected with bit line BLB through NPG_R (i.e., through the second signal path in the second switching circuit 306) and the voltage stored in the storage element (302 in FIG. 3A) at node BLFI will be allowed to develop on bit line BLB.

Bit line BLB, which was initially pre-charged to a high voltage level (e.g., VDD), will discharge to VSS through a signal path comprising NFETs NPG_R and NPD_R, until the voltage on bit line BLB is substantially equal to the voltage on node BLFI. The discharging of bit line BLB is detected by a corresponding sense amplifier (not explicitly shown) coupled to the bit line for generating an output signal that is indicative of a sensed logic state stored in the SRAM cell 300. As in the read "0" scenario, the discharging of bit line BLB will result in ground bounce on internal storage node BLFI. This ground bounce may, in some instances, lead to a flipping (i.e., reversal) of the logic state of the latch, thus resulting in a read error, if a voltage level of the ground bounce increases beyond a switching threshold of the inverter comprising devices PPU_R and NPD_R.

The 3T transmission gate structure comprising transistors PPG_L1, PPG_L2 and NPG_L which form the first switching circuit (304 in FIG. 3A) is configured to improve SNM in the SRAM cell 300 during the read "1" operation. From the perspective of the left side of the SRAM cell 300, during the read "1" operation, NFET NPG_L and PFET PPG_L1 will turn on when the word line WL goes high and word line WLB goes low, respectively. With NPG_L turned on, the second signal path in the first switching circuit (304 in FIG. 3A) will be enabled. With the internal storage node BLFI being at a logic low level, PFET PPG_L2 will turn on, thereby enabling the first signal path through PPG_L1 and PPG_L2 in the first switching circuit. Hence, the internal storage node BLTI will be connected with bit line BL through two parallel signal paths; namely, through PPG_L1 and PPG_L2, and through NPG_L (i.e., through the first and second signal paths in the first switching circuit 304). In this example, with the bit line BL pre-charged high (e.g., VDD), the voltage stored in the storage element (302 in FIG. 3A) at node BLTI will be substantially equal to the voltage on bit line BL, and thus no charging or discharging of the complementary bit line BL through the storage element will occur.

Figure 5:
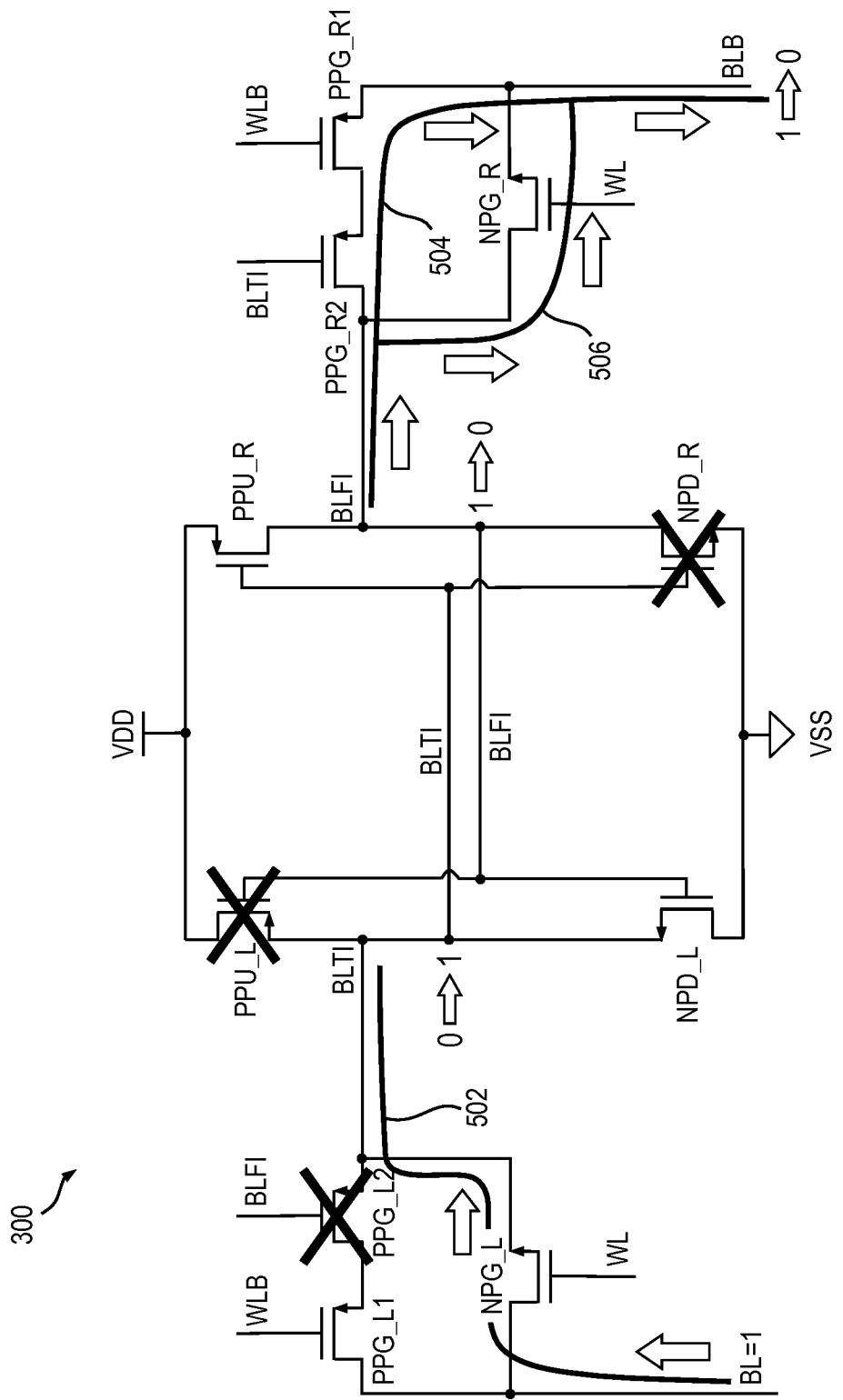
FIG. 5 is a schematic diagram depicting at least a portion of the exemplary SRAM cell with built-in read and write assist functionality shown in FIG. 3A during a write operation, according to an embodiment of the invention.

With reference now to FIG. 5, a schematic diagram depicts at least a portion of the exemplary SRAM cell 300 with built-in read and write assist functionality shown in FIG. 3A during a write operation, according to an embodiment of the invention. As previously stated, during a default (i.e., initial) state of the SRAM cell 300, such as when the cell is not being accessed in conjunction with a read or write operation, the word line WL will be at logic low level (i.e., de-asserted) and the complementary bit lines BL and BLB will be pre-charged to a prescribed voltage level (e.g., VDD). Moreover, assume that the data stored in the storage element (302 in FIG. 3A) is a logic "0," such that internal storage node BLTI is at a logic low level (e.g., VSS) and complementary internal storage node BLFI is at a logic high level (e.g., VDD). With the word line WL at a logic low level (e.g., "0" or VSS), the complementary word line WLB will be at a logic high level. In this scenario, NFET devices NPG_L and NPG_R, and PFET devices PPG_L1, PPG_L2 and PPG_R1 will be turned off, thereby electrically disconnecting the internal storage nodes BLTI and BLFI from the bit lines BL and BLB, respectively. Although PFET PPG_R2 is turned on, the connection path through the second switching circuit (i.e., through devices PPG_R1 and PPG_R2) will be disabled since PPG_R1 is turned off. With internal storage node BLTI at a logic low level and BLFI at a logic high level, PFET pull-up device PPU_R and NFET pull-down device NPD_L will be turned on, and PFET pull-up device PPU_L and NFET pull-down device NPD_R will be turned off, thereby allowing node BLTI to be held low through NPD_L and node BLFI to be held high through PPU_R.

During a write operation, the bit lines BL and BLB are released from their pre-charged state (e.g., by disconnecting the bit lines from pre-charge circuitry, not explicitly shown but implied) and the word line WL connected with the SRAM cell 300 is asserted; in this example, WL is driven to a logic high level (e.g., VDD). With the word line WL at a logic high level, the inverted word line WLB will be at a logic low level. As a result, NPG_L, NPG_R, PPG_L1 and PPG_R1 will turn on. With the internal storage node BLFI being initially at a logic high level, PFET PPG_L2 will be turned off, thereby disabling the first signal path through PPG_L1 and PPG_L2 in the first switching circuit (304 in FIG. 3A). Thus, the internal storage node BLTI will be connected with bit line BL via connection path 502 through NPG_L (i.e., through the second signal path in the first switching circuit 304). With the internal storage node BLTI being initially at a logic low level, PFET PPG_R2 will be turned on, and thus the internal storage node BLFI will be connected with bit line BLB through parallel connection paths; namely, connection path 504 through transistors PPG_R1 and PPG_R2, and connection path 506 through NPG_R (i.e., through the first and second signal paths in the second switching circuit 303).

In the case of a write "1" operation, bit line BL is driven to a logic high voltage level and complementary bit line BLB is driven to a logic low voltage level (e.g., through write driver circuitry coupled to the bit lines, not explicitly shown but implied). Additionally, the word line WL is asserted (driven high in this scenario), thereby turning on NFET devices NPG_L and NPG_R. Since transistor NPG_L is turned on, a direct current path is established between bit line BL, internal storage node BLTI and ground. This series structure of NFETs NPG_L and NPD_L created by the 3T transmission gate structure of the first switching circuit (304 in FIG. 3A) results in ground bounce occurring on node BLTI. The ground bounce in this write operation, however, beneficially assists in writing a "1" into the SRAM cell 300.

Substantially concurrently, node BLFI, which was initially at a high voltage level (pre-charged), will discharge through connection paths 504 and 506 to bit line BLB (which is at a low level) established by the 3T transmission gate structure of the second switching circuit (306 in FIG. 3A). Once node BLFI falls to below a PFET threshold from VDD, PFET PPU_L will turn on, thereby assisting to pull node BLTI up to VDD. Additionally, PFET PPG_L2 will turn on, enabling a second signal path, via PFETs PPG_L1 and PPG_L2, through which bit line BL will charge node BLTI. Once node BLTI rises to within a PFET threshold of VDD, transistor PPU_R will turn off. This action causes the logic state of the storage element to reverse, such that internal storage node BLTI is at a high logic level and complementary internal storage node BLFI is at a low logic level.

As previously stated, internal storage node BLFI is held high through a single PFET PPU_R, whereas the 3T transmission gate structure comprising transistors PPG_R1, PPG_R2 and NPG_R tries to pull node BLFI towards VSS. With the greater strength of the 3T transmission gate structure, node BLFI will be pulled down to VSS more easily. By comparison, in the 6T SRAM cell 200 without read and write assist functionality shown in FIG. 2, the internal storage node BLFI is pulled down only through a single NFET device, NPD_R. Although SRAM cell 200 includes an NFET transmission gate NPG_R, this device remains off until bit line BLB, which is initially pre-charge high, falls below the threshold voltage of NPG_R. In the SRAM cell 300, with node BLFI connected to bit line BLB through a 3T transmission gate structure, as soon as the word line WL goes high, the series signal path through the PFETs PPG_R1 and PPG_R2 is established, even though the NFET NPG_R is stilled turned off; write begins as soon as BLB starts transitioning low. Consequently, with the assistance of the 3T transmission gate structure, the write operation for the SRAM cell 300 shown in FIG. 3A is considerably faster compared to the SRAM cell 200 shown in FIG. 2. Moreover, write margin is improved, compared to a standard 6T SRAM arrangement, since node BLFI is pulled down with additional strength through the 3T transmission gate structure.

The storage element (302 in FIG. 3A) is configured to store its logical state through the action of the cross-coupled inverters which function as a latch. Specifically, with internal storage node BLTI being at a high level, PFET PPU_R will be turned off and NFET NPD_R will be turned on, thereby holding internal storage node BLFI low. Likewise, with node BLFI being at a low level, PFET PPU_L will be turned on and NFET NPD_L will be turned off, thereby holding node BLTI high.

In the case of a write "0" operation, the SRAM cell 300 functions in essentially the same manner as for the write "1" operation previously described, only with the operation of the left and right sides of the cell swapped.

Multiple embodiments of an SRAM cell with built-in read and write assist functionality are shown and described herein, by way of example only and without limitation. However, while specific illustrative circuit arrangements are shown in FIGS. 3A through 5, it is to be appreciated that numerous other modifications to the SRAM cell with built-in read and write assist functionality are contemplated, in accordance with embodiments of the invention, that enable the SRAM cell to be used in a variety of single-port and multi-port memory architectures and applications, as will become apparent to those skilled in the art given the teachings herein.

It should be understood that the use of PMOS and NMOS transistor devices in the particular memory cell embodiments shown in the figures and described herein above are by way of illustration only. In other embodiments, the conductivity type of each of certain transistor devices in the memory cell may be substituted with a transistor device having a reverse conductivity type. For example, a PMOS device may be replaced by an NMOS device, with a logical complement of a control signal supplied to the PMOS device being supplied to the NMOS device, as will become readily apparent to those skilled in the art. These alternative circuit configurations are within the scope of one or more embodiments of this invention.

Figure 6:
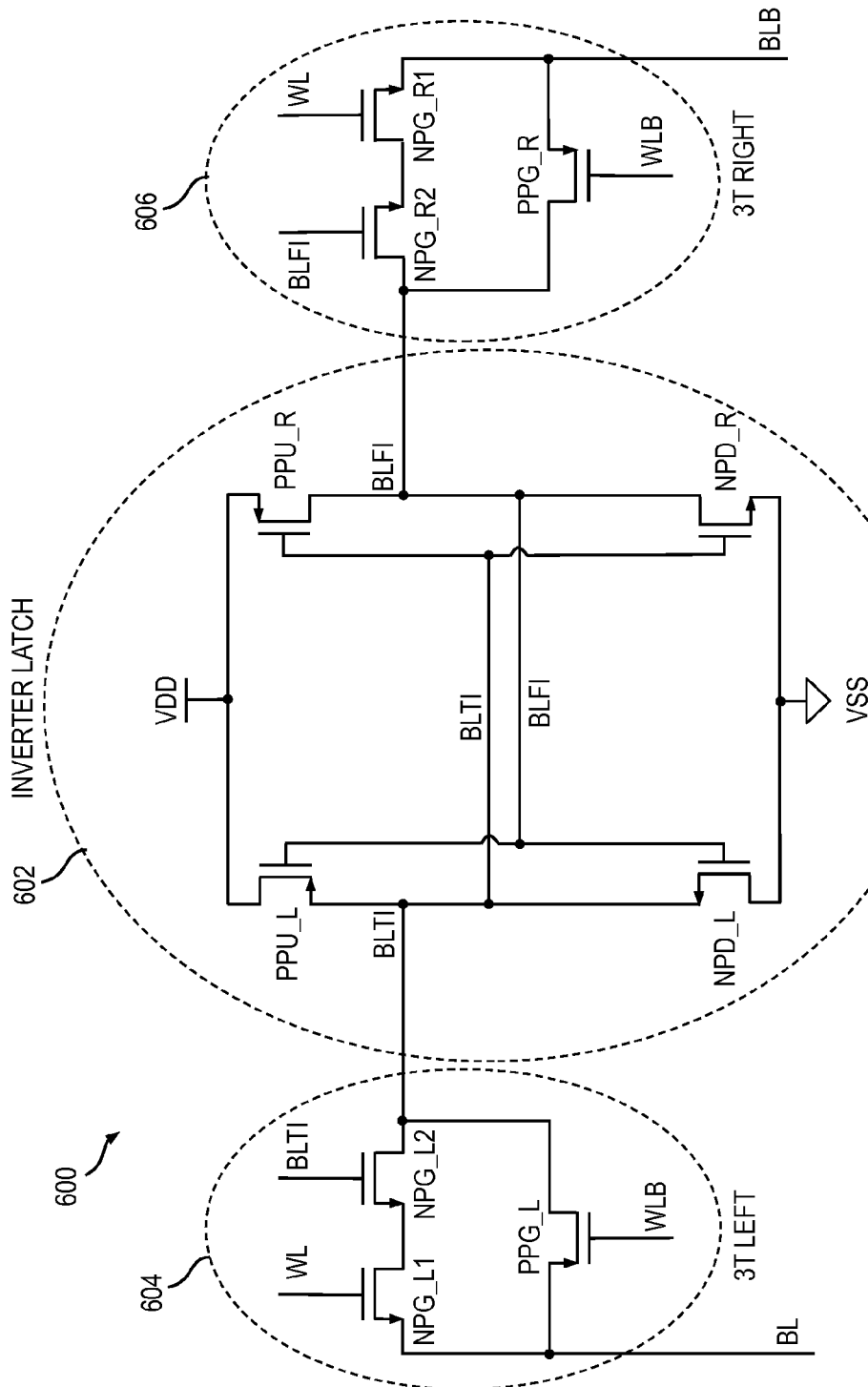
FIG. 6 is a schematic diagram depicting at least a portion of an exemplary SRAM memory cell with built-in read and write assist functionality, according to another embodiment of the invention.

By way of example only and without limitation, FIG. 6 is a schematic diagram depicting at least a portion of an exemplary SRAM memory cell 600 with built-in read and write assist functionality, according to another embodiment of the invention. As apparent from FIG. 6, the exemplary SRAM cell 600 is implemented in a manner consistent with the illustrative SRAM cell 300 depicted in FIG. 3A, except that the transistors forming the first and second switching circuits 304 and 306, respectively, in SRAM cell 300 have been substituted with transistors having an opposite conductivity type, and control signals supplied to the switching circuits have been inverted.

More particularly, with reference to FIG. 6, SRAM cell 600 includes a storage element 602 and first and second switching circuits 604 and 606, respectively, for selectively connecting the storage element with a pair of complementary bit lines BL and BLB. The storage element 602 is essentially the same as storage element 302 shown in FIG. 3A, except that the sizes (i.e., channel width-to-length ratios) of the PFET and NFET devices are swapped in the storage element 602 compared to the storage element 302 shown in FIG. 3A. Each of the switching circuits 604, 606 is implemented as a 3T transmission gate structure having two independently-controlled signal paths; a first signal path comprising two series-connected NFET devices, and a second signal path comprising a PFET device. Specifically, the first switching circuit 604 includes a first NFET NPG_L1, a second NFET NPG_L2, and a PFET PPG_L. Sources of NPG_L1 and PPG_L are connected together and are adapted for connection with a first bit line BL, a drain of NPG_L1 is connected with a source of NPG_L2, and drains of NPG_L2 and PPG_L are connected with a first internal storage node, BLTI, of the storage element 602. Similarly, the second switching circuit 606 includes a first NFET NPG_R1, a second NFET NPG_R2, and a PFET PPG_R. Sources of NPG_R1 and PPG_R are connected together and are adapted for connection with a second bit line BLB which is a complement of the first bit line BL, a drain of NPG_R1 is connected with a source of NPG_R2, and drains of NPG_R2 and PPG_R are connected with a second internal storage node, BLFI, of the storage element 602. The behavior of the SRAM cell 600, and particularly the first and second switching circuits 604 and 606, respectively, during read and write operations will be consistent with the operation of the exemplary SRAM cell 300 previously described in conjunction with FIGS. 3A through 5.

A given memory cell and/or memory device configured in accordance with one or more embodiments of the invention may be implemented as a standalone memory device, for example, as a packaged integrated circuit (IC) memory device suitable for incorporation into a higher-level circuit board or other system. Alternatively, one or more embodiments of the invention may be implemented as an embedded memory device, where the memory may be, for example, embedded into a processor or other type of integrated circuit device which comprises additional circuitry coupled with the memory device. More particularly, a memory device as described herein may comprise an embedded memory implemented within a microprocessor, digital signal processor (DSP), application-specific integrated circuit (ASIC), field-programmable gate array (FPGA), or other type of processor or integrated circuit device.

Figure 7:
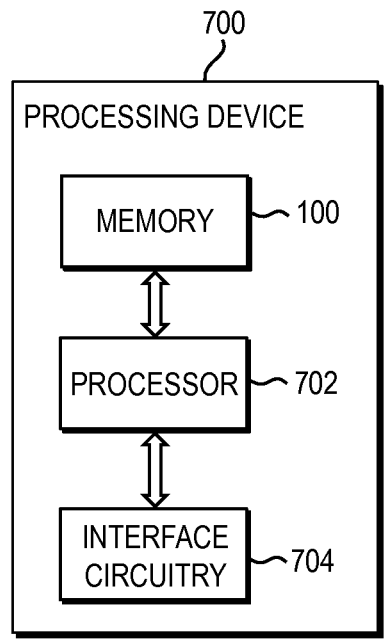
FIG. 7 is a block diagram depicting at least a portion of an exemplary processing device which incorporates the illustrative memory device shown in FIG. 1, according to an embodiment of the invention.

FIG. 7 is a block diagram depicting at least a portion of an exemplary processing device 700 which incorporates the illustrative memory device 100 of FIG. 1, according to an embodiment of the invention. In this embodiment, the memory device 100, which comprises one or more memory cells configured in accordance with one or more embodiments of the invention, is coupled with a processor 702. The processing device 700 further includes interface circuitry 704 coupled with the processor 702. The processing device 700 may comprise, for example, a computer, a server, a communication device, including, but not limited to, a mobile phone or tablet device, etc. The interface circuitry 704 may comprise one or more transceivers for allowing the processing device 700 to communicate over a network or other communication channel.

Figure 8:
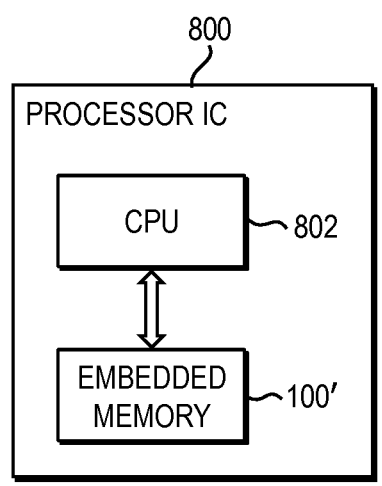
FIG. 8 is a block diagram depicting at least a portion of an exemplary processor integrated circuit incorporating the illustrative memory device shown in FIG. 1 as an embedded memory, according to an embodiment of the invention.

Alternatively, processing device 700 may comprise a microprocessor, DSP or ASIC, with processor 702 corresponding to a central processing unit (CPU) and memory device 100 providing at least a portion of an embedded memory of the microprocessor, DSP or ASIC. By way of example only and without limitation, FIG. 8 is a block diagram depicting at least a portion of an exemplary processor integrated circuit 800 incorporating the memory device of FIG. 1 as an embedded memory 100', according to an embodiment of the invention. The embedded memory 100' in this embodiment is coupled with a CPU 802.

In an integrated circuit implementation of one or more embodiments of the invention, multiple identical die are typically fabricated in a repeated pattern on a surface of a semiconductor wafer. Each such die may include a device described herein, and may include other structures and/or circuits. The individual dies are cut or diced from the wafer, then packaged as integrated circuits. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

Figure 9:
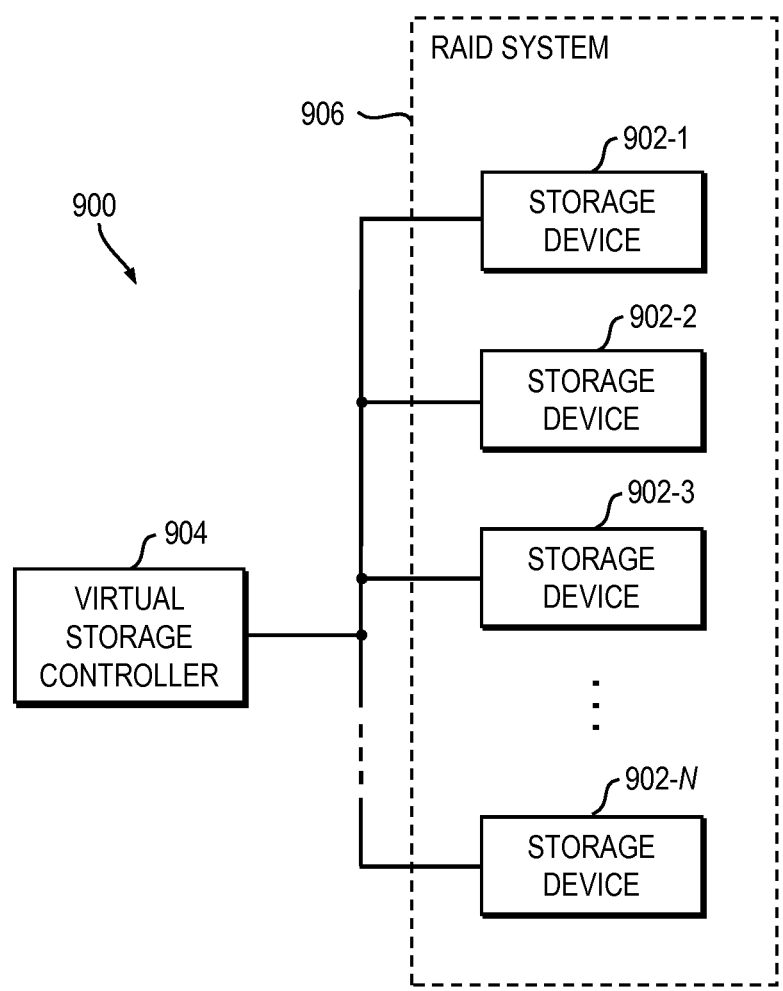
FIG. 9 is a block diagram depicting at least a portion of an exemplary virtual storage system comprising multiple storage devices, at least one of the storage devices including an SRAM cell with built-in read and write assist functionality, according to an embodiment of the invention.

Embodiments of the invention are suitable for use in conjunction with a virtual storage system 900 comprising multiple storage devices 902-1 through 902-N, possibly of multiple different types, as illustrated in FIG. 9. For example, the storage devices 902-1 through 902-N may be implemented using all hard disk drives (HDDs), all solid-state drives (SSDs), or using a combination of one or more HDDs and one or more SSDs. Other storage device types are similarly contemplated. The virtual storage system 900, also referred to as a storage virtualization system, illustratively comprises a virtual storage controller 904 coupled with a redundant array of independent devices (RAID) system 906. As will be known by those skilled in the art, RAID is a storage technology that provides increased reliability, among other features, through redundancy. This is accomplished by combining multiple physical storage components (e.g., HDDs, SSDs, etc.) into a logical (i.e., virtual) unit, where data is distributed across the multiple storage components in one of a plurality of ways, generally referred to as "RAID levels." The RAID system 906 more specifically comprises N distinct storage devices denoted 902-1, 902-2, ... 902-N, where N is an integer greater than one. As previously stated, all storage devices 902-1 through 902-N need not be of the same type. Furthermore, one or more of the storage devices 902-1 through 902-N of the RAID system 906 are assumed to be configured to include apparatus and/or circuitry as disclosed herein. These and other virtual storage systems comprising multiple storage devices (e.g., HDDs, SSDs, or some combination of HDDs and SSDs), are considered embodiments of the invention.

The illustrations of embodiments of the invention described herein are intended to provide a general understanding of the structure of various embodiments, and they are not intended to serve as a complete description of all the elements and features of apparatus and systems that might make use of the structures described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Written Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Written Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A memory cell having integrated read and write assist functionality, the memory cell comprising:
a storage element for storing a logical state of the memory cell, the storage element comprising a pair of cross-coupled inverters configured as a latch;
a first switching circuit configured to selectively couple a first internal storage node of the storage element with a first bit line as a function of a first plurality of control signals;
a second switching circuit configured to selectively couple a second internal storage node of the storage element with a second bit line as a function of a second plurality of control signals;
wherein during a read operation of the memory cell, at least one of the first and second switching circuits is configured to increase a switching threshold of at least one inverter of the pair of inverters in the storage element, and during a write operation of the memory cell, at least a given one of the first and second switching circuits is configured such that ground bounce associated with the given one of the first and second switching circuits assists in writing a logical state of the memory cell, wherein the ground bounce occurs as a result of a bit line discharging and potentially flipping a logic state of the one of the first and second internal storage nodes.

2. The memory cell of claim 1, wherein each of the first and second switching circuits comprises at least two parallel connection paths for connecting a corresponding one of the internal storage nodes of the storage element with a corresponding one of the first and second bit lines, respectively, each of the connection paths in the first and second switching circuits being individually controlled as a function of at least one control signal in a corresponding one of the first and second plurality of control signals, respectively.

3. The memory cell of claim 2, wherein the first and second switching circuits are configured such that during a read operation of the memory cell, when the first internal storage node is at a low logic level and a word line coupled with the memory cell is asserted, a first one of the connection paths in the first switching circuit is disabled and a second one of the connection paths in the first switching circuit is enabled, and the at least two connection paths in the second switching circuit are enabled to thereby increase a switching threshold of a first inverter of the pair of inverters in the storage element which is connected with the second internal storage node, and when the first internal storage node is at a high logic level and a word line coupled with the memory cell is asserted, a first one of the connection paths in the second switching circuit is disabled and a second one of the connection paths in the second switching circuit is enabled, and the at least two connection paths in the first switching circuit are enabled to thereby increase a switching threshold of a second inverter of the pair of inverters in the storage element which is connected with the first internal storage node.

4. The memory cell of claim 2, wherein during a write "1" operation of the memory cell, the first switching circuit is configured such that, when the first internal storage node is at a low logic level and a word line coupled with the memory cell is asserted, at least a first one of the connection paths in the first switching circuit is enabled so as to connect the first bit line with the first internal storage node to thereby generate ground bounce on the first internal storage node which assists in writing the storage element to a logic "1" state, and the second switching circuit is configured such that the at least two connection paths in the first switching circuit are enabled to thereby provide a discharge path for the second internal storage node through the second switching circuit.

5. The memory cell of claim 2, wherein at least one of the connection paths in each of the first and second switching circuits is controlled as a function of at least two control signals in a corresponding one of the first and second plurality of control signals, respectively.

6. The memory cell of claim 1, wherein each of the first and second switching circuits comprises at least first and second p-type field-effect transistors (PFETs) and an n-type field-effect transistor (NFET), a first source/drain of the first PFET and a first source/drain of the NFET being connected with a corresponding one of the first and second bit lines, a second source/drain of the first PFET being connected with a first source/drain of the second PFET, a second source/drain of the second PFET and a second source/drain of the NFET being connected with a corresponding one of the first and second internal storage nodes of the storage element, a gate of the NFET being connected with a corresponding word line, a gate of the first PFET being connected with a corresponding complementary word line, and a gate of the second PFET being connected with a complement of the corresponding one of the first and second internal storage nodes.

7. The memory cell of claim 1, wherein each of the first and second switching circuits comprises at least first and second n-type field-effect transistors (NFETs) and a p-type field-effect transistor (PFET), a first source/drain of the first NFET and a first source/drain of the PFET being connected with a corresponding one of the first and second bit lines, a second source/drain of the first NFET being connected with a first source/drain of the second NFET, a second source/drain of the second NFET and a second source/drain of the PFET being connected with a corresponding one of the first and second internal storage nodes of the storage element, a gate of the PFET being connected with a corresponding complementary word line, a gate of the first NFET being connected with a corresponding word line, and a gate of the second NFET being connected with the corresponding one of the first and second internal storage nodes.

8. The memory cell of claim 1, wherein each of the first and second switching circuits comprises at least first and second p-type field-effect transistors (PFETs) and first and second ntype field-effect transistors (NFETs), a first source/drain of the first PFET and a first source/drain of the first NFET being connected with a corresponding one of the first and second bit lines, a second source/drain of the first PFET being connected with a first source/drain of the second PFET, a second source/drain of the first NFET being connected with a first source/drain of the second NFET, a second source/drain of the second PFET and a second source/drain of the second NFET being connected with a corresponding one of the first and second internal storage nodes of the storage element, a gate of the first NFET being connected with a corresponding word line, a gate of the first PFET being connected with a corresponding complementary word line, a gate of the second NFET being connected with the corresponding one of the first and second internal storage nodes, and a gate of the second PFET being connected with a complement of the corresponding one of the first and second internal storage nodes.

9. The memory cell of claim 1, wherein the storage element comprises:
a first inverter including a first pull-up transistor and a first pull-down transistor, a first source/drain of the first pull-up transistor being connected with a first voltage source, a second source/drain of the first pull-up transistor being connected with a first source/drain of the first pull-down transistor at the first internal storage node, a second source/drain of the first pulldown transistor being connected with a second voltage source, and gates of the first pull-up and pull-down transistors being connected with the second internal storage node; and a second inverter including a second pull-up transistor and a second pull-down transistor, a first source/drain of the second pull-up transistor being connected with the first voltage source, a second source/drain of the second pull-up transistor being connected with a first source/drain of the second pull-down transistor at the second internal storage node, a second source/drain of the second pull-down transistor being connected with the second voltage source, and gates of the first pull-up and pull-down transistors being connected to the first internal storage node.

10. The memory cell of claim 9, wherein each of the first and second switching circuits is configured such that multiple connection paths between a corresponding one of the first and second internal storage nodes and a corresponding one of the first and second bit lines are established during a write operation to pull-down the corresponding one of the first and second internal storage nodes with a greater strength relative to a strength of a corresponding one of the first and second pull-up transistors.

11. The memory cell of claim 1, wherein the memory cell is fabricated as at least a portion of an integrated circuit.

12. A memory device, comprising:
a plurality of memory cells;
at least one word line and a plurality of bit lines, the word line and bit lines being coupled with the memory cells for individually accessing the memory cells;
wherein each memory cell of at least a subset of the memory cells comprises:
a storage element for storing a logical state of the memory cell, the storage element comprising a pair of cross-coupled inverters configured as a latch;
a first switching circuit configured to selectively couple a first internal storage node of the storage element with a first one of the bit lines as a function of a first plurality of control signals;
a second switching circuit configured to selectively couple a second internal storage node of the storage element with a second one of the bit lines as a function of a second plurality of control signals;
wherein during a read operation of the memory cell, at least one of the first and second switching circuits is configured to increase a switching threshold of at least one inverter of the pair of inverters in the storage element, and during a write operation of the memory cell, at least a given one of the first and second switching circuits is configured such that ground bounce associated with the given one of the first and second switching circuits assists in writing a logical state of the memory cell, wherein the ground bounce occurs as a result of a bit line discharging and potentially flipping a logic state of the one of the first and second internal storage nodes.

13. The memory device of claim 12, wherein each of the first and second switching circuits in each memory cell of at least a subset of the memory cells comprises at least two parallel connection paths for connecting a corresponding one of the internal storage nodes of the storage element with a corresponding one of the bit lines, respectively, each of the connection paths in the first and second switching circuits being individually controlled as a function of at least one control signal in a corresponding one of the first and second plurality of control signals, respectively.

14. The memory device of claim 13, wherein the first and second switching circuits in each memory cell of at least a subset of the memory cells are configured such that during a read operation of the memory cell, when the first internal storage node is at a low logic level and the word line coupled with the memory cell is asserted, a first one of the connection paths in the first switching circuit is disabled and a second one of the connection paths in the first switching circuit is enabled, and the at least two connection paths in the second switching circuit are enabled to thereby increase a switching threshold of a first inverter of the pair of inverters in the storage element which is connected with the second internal storage node, and when the first internal storage node is at a high logic level and the word line coupled with the memory cell is asserted, a first one of the connection paths in the second switching circuit is disabled and a second one of the connection paths in the second switching circuit is enabled, and the at least two connection paths in the first switching circuit are enabled to thereby increase a switching threshold of a second inverter of the pair of inverters in the storage element which is connected with the first internal storage node.

15. The memory device of claim 13, wherein during a write "1" operation of the memory cell, the first switching circuit is configured such that, when the first internal storage node is at a low logic level and a word line coupled with the memory cell is asserted, at least a first one of the connection paths in the first switching circuit is enabled so as to connect the first bit line with the first internal storage node to thereby generate ground bounce on the first internal storage node which assists in writing the storage element to a logic "1" state, and the second switching circuit is configured such that the at least two connection paths in the first switching circuit are enabled to thereby provide a discharge path for the second internal storage node through the second switching circuit.

16. The memory device of claim 13, wherein at least one of the connection paths in each of the first and second switching circuits is controlled as a function of at least two control signals in a corresponding one of the first and second plurality of control signals, respectively.

17. The memory device of claim 12, wherein each of the first and second switching circuits comprises at least first and second p-type field-effect transistors (PFETs) and an n-type field-effect transistor (NFET), a first source/drain of the first PFET and a first source/drain of the NFET being connected with a corresponding one of the first and second bit lines, a second source/drain of the first PFET being connected with a first source/drain of the second PFET, a second source/drain of the second PFET and a second source/drain of the NFET being connected with a corresponding one of the first and second internal storage nodes of the storage element, a gate of the NFET being connected with a corresponding word line, a gate of the first PFET being connected with a corresponding complementary word line, and a gate of the second PFET being connected with a complement of the corresponding one of the first and second internal storage nodes.

18. The memory device of claim 12, further comprising pre-charge circuitry coupled to at least a subset of the plurality of bit lines, the pre-charge circuitry being operative, when memory cells coupled with the subset of the plurality of bit lines are not being accessed in conjunction with a read or write operation, to set the subset of the plurality of bit lines to a prescribed voltage level.

19. The memory device of claim 12, wherein the memory device comprises at least one of an embedded memory and a standalone memory.

20. A data storage system, comprising:
a plurality of storage devices, wherein at least one of the plurality of storage devices includes a memory device comprising:
   a plurality of memory cells;
   at least one word line and a plurality of bit lines, the word line and bit lines being coupled with the memory cells for individually accessing the memory cells;
   wherein each memory cell of at least a subset of the memory cells comprises:
      a storage element for storing a logical state of the memory cell, the storage element comprising a pair of cross-coupled inverters configured as a latch;
      a first switching circuit configured to selectively couple a first internal storage node of the storage element with a first one of the bit lines as a function of a first plurality of control signals;
      a second switching circuit configured to selectively couple a second internal storage node of the storage element with a second one of the bit lines as a function of a second plurality of control signals;
   wherein during a read operation of the memory cell, at least one of the first and second switching circuits is configured to increase a switching threshold of at least one inverter of the pair of inverters in the storage element, and during a write operation of the memory cell, at least a given one of the first and second switching circuits is configured such that ground bounce associated with the given one of the first and second switching circuits assists in writing a logical state of the memory cell, wherein the ground bounce occurs as a result of a bit line discharging and potentially flipping a logic state of the one of the first and second internal storage nodes.

21. The data storage system of claim 20, wherein the at least one of the plurality of storage devices is configured as a device in a redundant array of independent devices (RAID) system.

* * * * *